US006566215B1

(12) United States Patent
Chong et al.

(10) Patent No.: US 6,566,215 B1
(45) Date of Patent: May 20, 2003

(54) METHOD OF FABRICATING SHORT CHANNEL MOS TRANSISTORS WITH SOURCE/DRAIN EXTENSIONS

(75) Inventors: Yung Fu Chong, Singapore (SG); Lap Chan, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 10/163,687

(22) Filed: Jun. 6, 2002

(51) Int. Cl.$^7$ .............................................. H01L 21/336
(52) U.S. Cl. ....................................... 438/305; 438/306
(58) Field of Search ................................ 438/301, 303, 438/305, 306, 307, 595

(56) References Cited

U.S. PATENT DOCUMENTS

| | | | | |
|---|---|---|---|---|
| 5,434,093 A | * | 7/1995 | Chau et al. ................... | 438/300 |
| 5,534,447 A | * | 7/1996 | Hong ........................... | 438/305 |
| 5,811,340 A | * | 9/1998 | Park ............................ | 438/291 |
| 5,858,848 A | * | 1/1999 | Gardner et al. .............. | 438/305 |
| 5,869,374 A | * | 2/1999 | Wu .............................. | 438/291 |
| 6,100,146 A |   | 8/2000 | Gardner et al. .............. | 438/301 |
| 6,133,106 A |   | 10/2000 | Evans et al. ................. | 438/299 |
| 6,207,485 B1 | * | 3/2001 | Gardner et al. .............. | 438/216 |
| 6,214,670 B1 |   | 4/2001 | Shih et al. ................... | 438/259 |
| 6,225,173 B1 | * | 5/2001 | Yu ................................ | 438/301 |
| 6,258,679 B1 |   | 7/2001 | Burns et al. .................. | 438/303 |
| 6,319,783 B1 | * | 11/2001 | Ang et al. ..................... | 438/300 |
| 6,440,830 B1 | * | 8/2002 | Lopatin ........................ | 438/592 |
| 2003/0001205 A1 | * | 1/2003 | Kim et al. .................... | 257/336 |

* cited by examiner

*Primary Examiner*—Carl Whitehead, Jr.
*Assistant Examiner*—Stephen W. Smoot
(74) *Attorney, Agent, or Firm*—George O. Saile; Rosemary L. S. Pike

(57) ABSTRACT

A novel method for forming short channel MOS transistors is described. A hard mask stack is formed over a substrate. A first opening is formed through a top portion of the hard mask stack. Oxide spacers are formed on sidewalls of the first opening thereby forming a second opening smaller than the first opening. The second opening is filled with a polysilicon layer. Thereafter, the oxide spacers are removed. First ions are implanted into the substrate underlying the removed oxide spacers to form source/drain extensions. Then, the polysilicon layer is removed wherein the first opening remains and wherein the substrate is exposed in a channel region. A gate dielectric layer is formed over the channel region. The first opening is filled with a gate electrode material that is polished back to form a gate electrode. The hard mask stack is removed using the gate electrode as a mask. Second ions are implanted to form source/drain regions within the substrate adjacent to the gate electrode to complete the formation of a short channel MOS transistor in the fabrication of an integrated circuit device.

25 Claims, 7 Drawing Sheets

METHOD OF FABRICATING SHORT CHANNEL MOS TRANSISTORS WITH SOURCE/DRAIN EXTENSIONS

BACKGROUND OF THE INVENTION (1) Field of the Invention

The invention relates to the fabrication of integrated circuit devices, and more particularly, to a method of forming short channel MOSFET transistors with source/drain extensions in the fabrication of integrated circuits.

(2) Description of the Prior Art

In photolithography, various mask patterns distinguish between the parts that are to be etched and the parts that should remain. However, due to diffraction effects, the boundary regions of the mask pattern may not be well defined, especially when the line width of the mask patterns approaches that of the light wavelength. Therefore, as the gate width of semiconductor devices continues to be reduced, it is increasingly difficult to fabricate devices with dimensions of less than 0.1 micron by using conventional lithography methods. It is desired to find a method of forming short channel MOS transistors that will solve this problem.

A number of workers in the art have proposed trench type MOSFET fabrication methods. U.S. Pat. No. 6,133,106 to Evans et al discloses source/drain regions and gate of the same height where the gate is formed by a dummy gate replacement method. U.S. Pat. No. 6,100,146 to Gardner et al shows a trench etch process. U.S. Pat. No. 6,258,679 to Burns et al shows a damascene gate process. U.S. Pat. No. 6,214,670 to Shih et al teaches a short channel trench process to form a metal gate.

SUMMARY OF THE INVENTION

A principal object of the present invention is to provide an effective and very manufacturable method of forming a short channel MOSFET device.

A further object of the invention is to provide a method of forming short channel MOS transistors using existing lithographic technologies and mask sets.

Yet another object is to provide a method of forming short channel MOS transistors having an increased gate width.

A further object is to provide a method of forming short channel MOS transistors having an increased gate width using existing lithographic technologies and mask sets wherein the gate resistance is reduced.

A still further object is to provide a method of forming short channel MOS transistors having an increased gate width using existing lithographic technologies and mask sets wherein parasitic capacitance is reduced.

In accordance with the objects of this invention a novel method for forming short channel MOS transistors is achieved. A hard mask stack is formed over a substrate. A first opening is formed through a top portion of the hard mask stack. Oxide spacers are formed on sidewalls of the first opening thereby forming a second opening smaller than the first opening. The second opening is filled with a polysilicon layer. Thereafter, the oxide spacers are removed. First ions are implanted into the substrate underlying the removed oxide spacers to form source/drain extensions. Then, the polysilicon layer is removed wherein the first opening remains and wherein the substrate is exposed in a channel region. A gate dielectric layer is formed over the channel region. The first opening is filled with a gate electrode material that is polished back to form a gate electrode. The hard mask stack is removed using the gate electrode as a mask. Second ions are implanted to form source/drain regions within the substrate adjacent to the gate electrode to complete formation of a short channel MOS transistor in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The present invention forms short channel MOS transistors using existing lithographic technologies and mask sets in a novel method that solves the problem of decreased dimensions. Fabrication of costly masks that correspond to intended gate widths or the usage of advanced or complicated lithographic techniques may not be necessary. The process of the present invention can increase effectively the width of the gate and thus reduce gate resistance.

Figure 1:
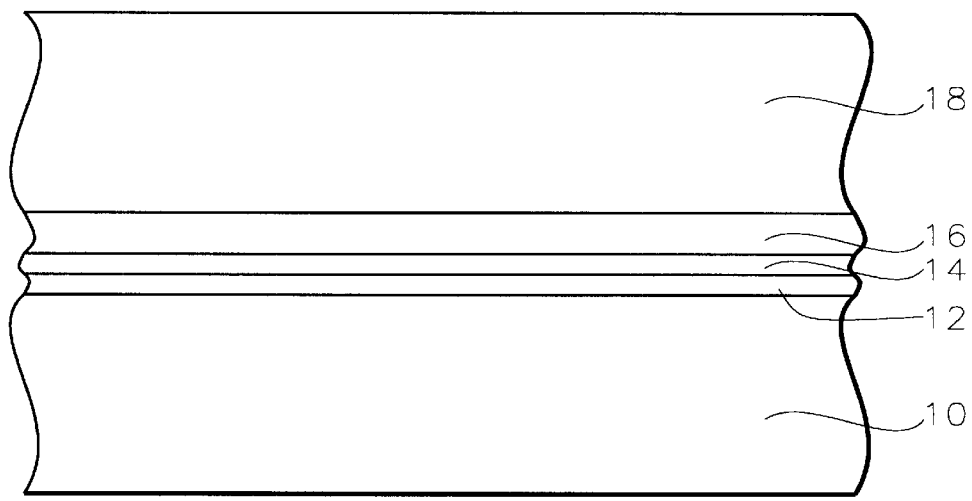
FIGS. 1 through 13 schematically illustrate in cross-sectional representation a preferred embodiment of the present invention.

Referring now more particularly to FIG. 1, there is shown an illustration of a portion of a partially completed metal oxide field effect transistor (MOSFET). The semiconductor substrate 10 is preferably composed of silicon having a (100) crystallographic orientation and has been doped to be a p-type substrate. It will be understood by those skilled in the art that while FIGS. 1 through 14 illustrate an N channel MOSFET integrated circuit device, a P channel FET integrated circuit device could be formed simply by substituting opposite polarities to those given for the N channel embodiment. Also, in a similar way, a CMOSFET could be formed by making both N channel and P channel devices upon the same substrate.

In an effort to simplify the description and the drawings the dielectric isolation between devices has been only partially shown and will not be described in detail, because they are conventional. For example, shallow trench isolation regions, not shown, may be formed in the semiconductor substrate.

Now a film stack will be deposited on the substrate 10. For example, a sacrificial oxide layer 12 is grown or deposited on the surface of the substrate to a thickness of between about 10 and 150 Angstroms. Now, a silicon nitride layer 14 is deposited over the sacrificial oxide layer 12 to a thickness of between about 200 and 500 Angstroms. Then a silicon oxide layer 16 is deposited over the nitride layer 14 to a thickness of between about 200 and 1000 Angstroms. Finally, a top silicon nitride layer 18 is deposited over the oxide layer 16 to a thickness of between about 200 and 1500 Angstroms. These materials are examples only; other materials may be used for the hard mask stack.

Figure 2:
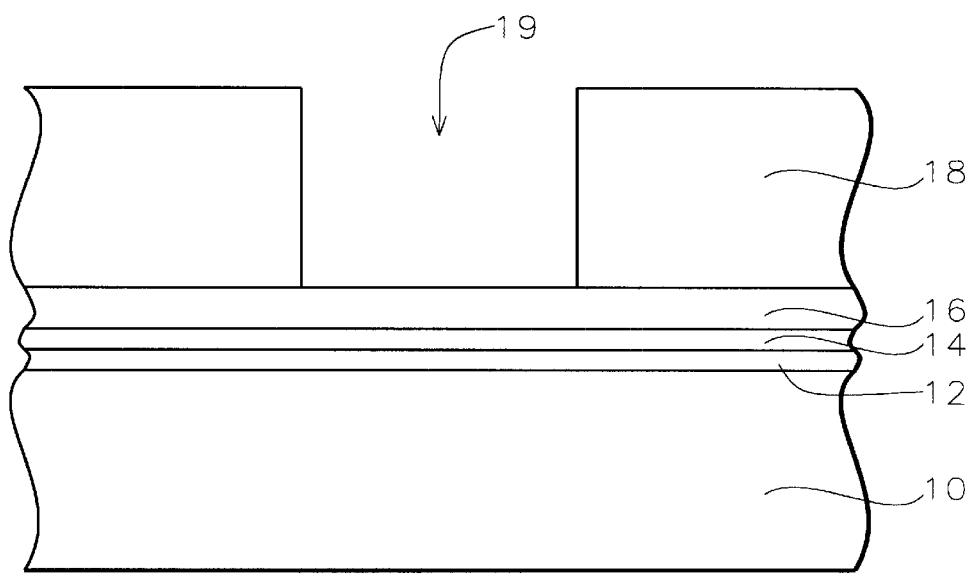
Figure 3:
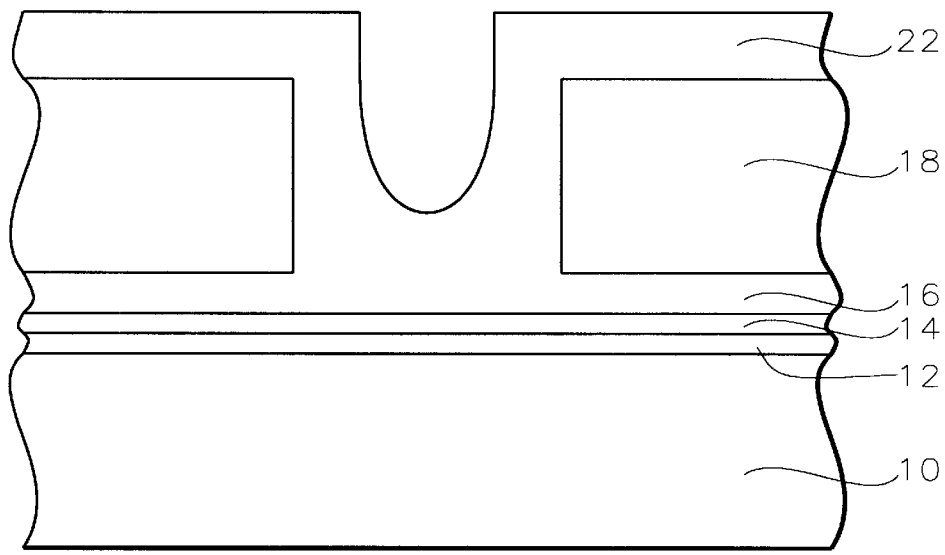
Figure 4:
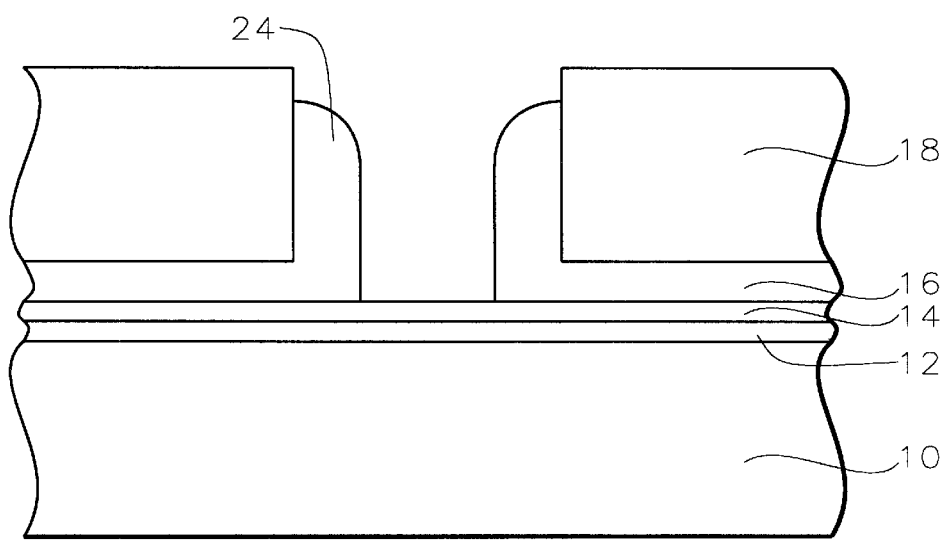

Using conventional lithographic and etching methods, the top nitride layer 18 is patterned to form an opening 19, as shown in FIG. 2. Referring now to FIG. 3, an oxide layer 22 is deposited by chemical vapor deposition to a selected thickness of between about 200 and 1000 Angstroms. Now, self-aligned oxide spacers 24 are formed, as shown in FIG.

4, by anisotropically etching the oxide layer 22. Overetching of the oxide should be performed so that the nitride layer 14 is exposed between the oxide spacers 24.

Figure 5:
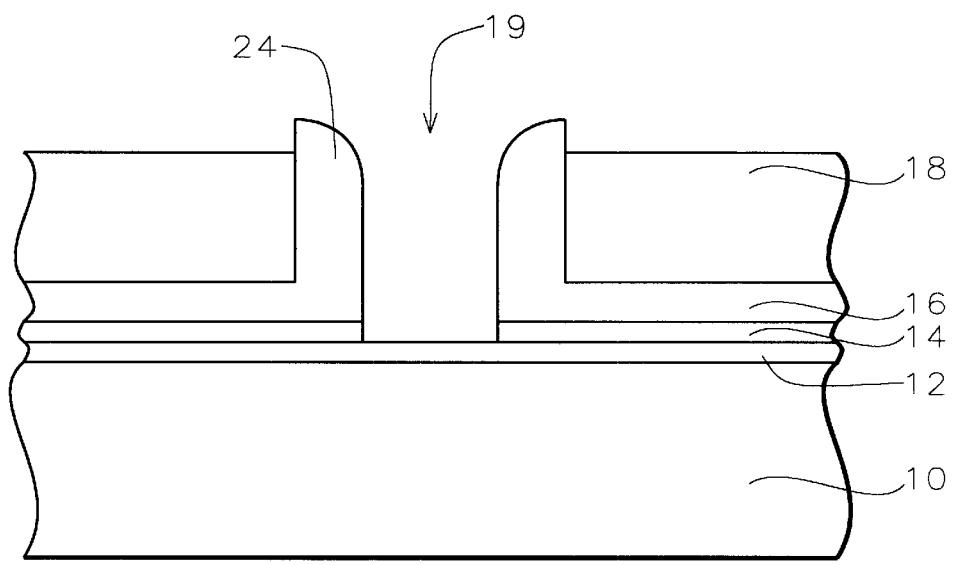

The nitride layers 14 and 18 are etched as shown in FIG. 5 with an etch stop at the oxide layer 12. The top nitride layer 18 is etched back to below the height of the oxide spacers 24. Preferably a reactive ion etching (RIE) is performed. This step is performed to facilitate subsequent chemical mechanical polishing (CMP).

Figure 6:
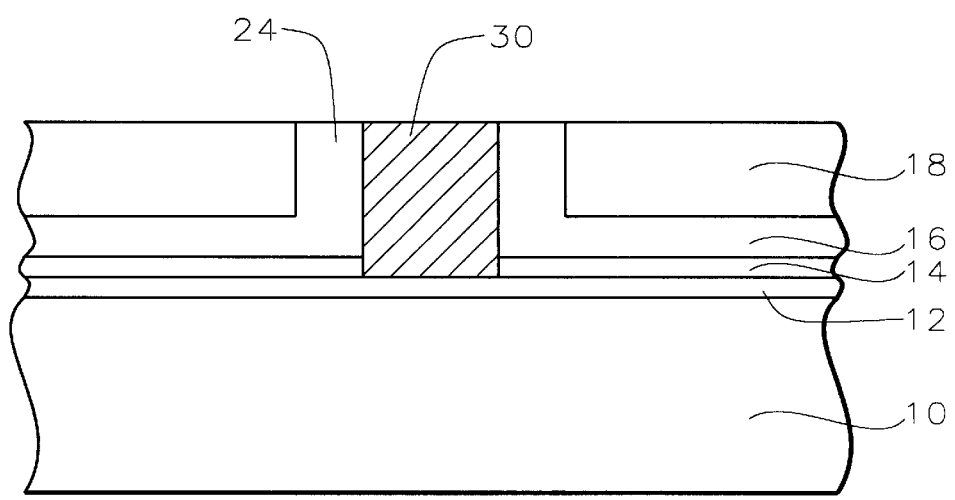
Figure 7:
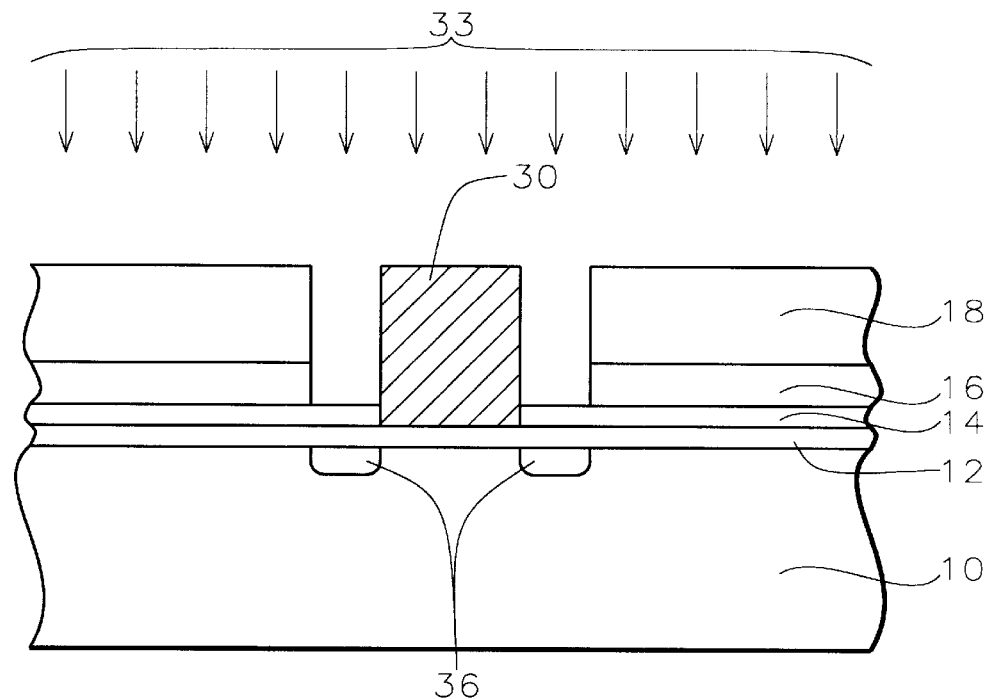

Referring now to FIG. 6, a polysilicon layer 30 is deposited over the film stack and conformally within the opening 19. CMP is performed to polish the surface of the substrate, leaving the polysilicon 30 only within the trench opening. The polysilicon will act as a blocking mask when forming the source/drain extensions.

Next, the oxide spacers 24 are removed, preferably by RIE, with an etch stop at the nitride layer 14. An ion implantation 33 is performed through the nitride and sacrificial oxide layers 14 and 12 to form the source/drain extensions 36 in the substrate underlying the now removed oxide spacers.

Figure 8:
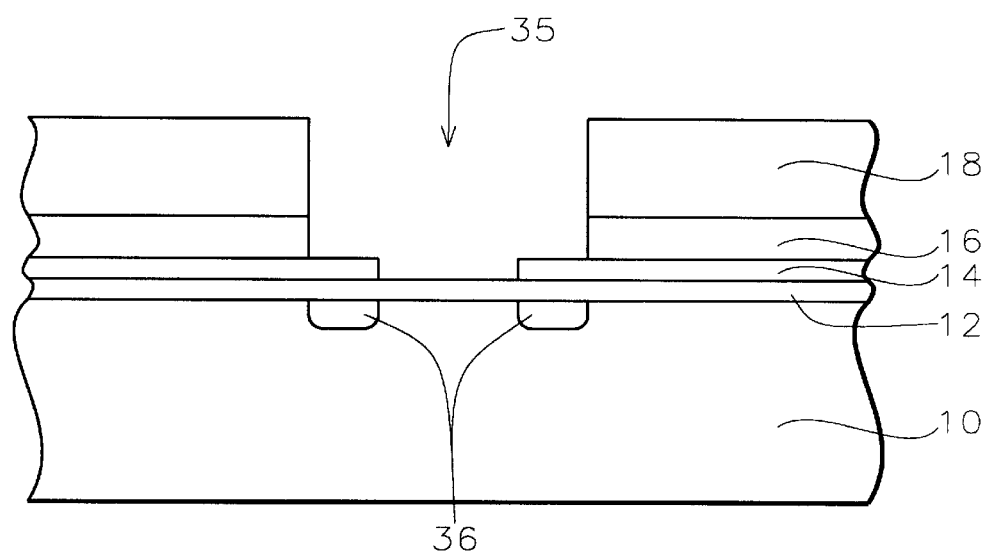
Figure 9:
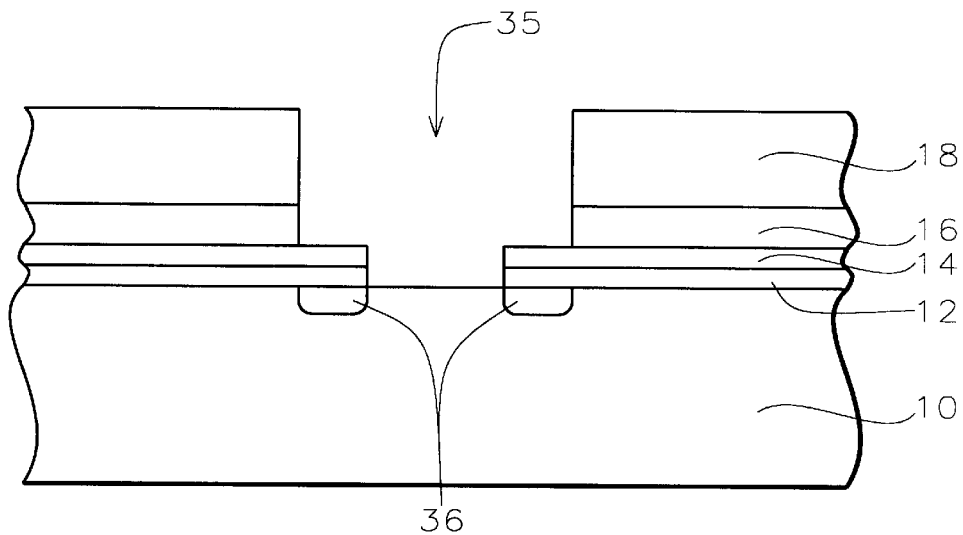

The polysilicon 30 now is selectively removed as shown in FIG. 8 to leave a larger opening 35. The sacrificial oxide 12 exposed underlying the now removed polysilicon layer is removed by a wet etch to expose the channel region of the substrate, as shown in FIG. 9. Now, an optional ion implantation into the channel for threshold voltage adjustment can be performed, not shown.

Figure 10:
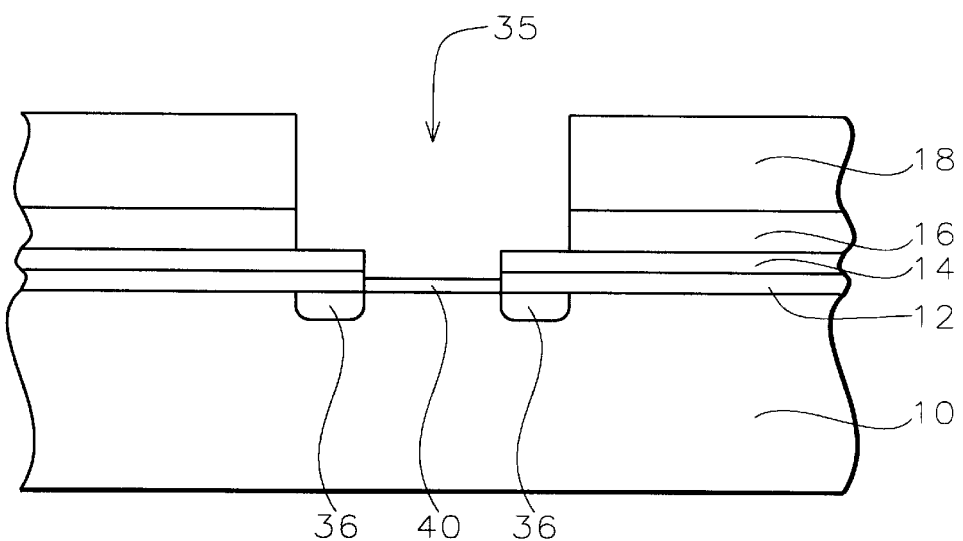

As illustrated in FIG. 10, a gate dielectric material 40 such as silicon oxide is grown on the substrate within the opening. Alternatively, a high dielectric constant gate dielectric material can be deposited over the substrate by chemical vapor deposition (CVD).

Figure 11:
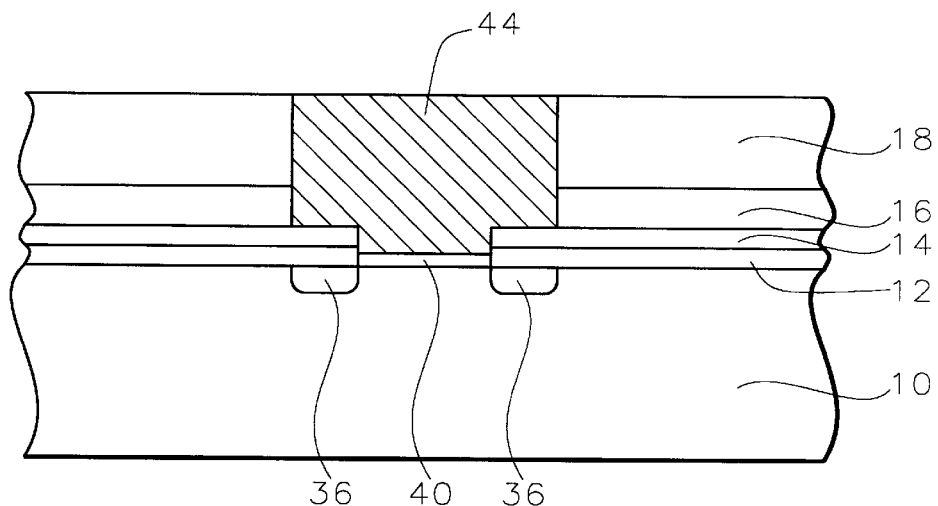

As shown in FIG. 11, a gate electrode material layer 44 is deposited over the film stack and within the opening 35. For example, the gate material may be polycrystalline silicon germanium, polysilicon or a metal. The gate material layer is polished by CMP to leave the gate material only within the opening 35.

Figure 12:
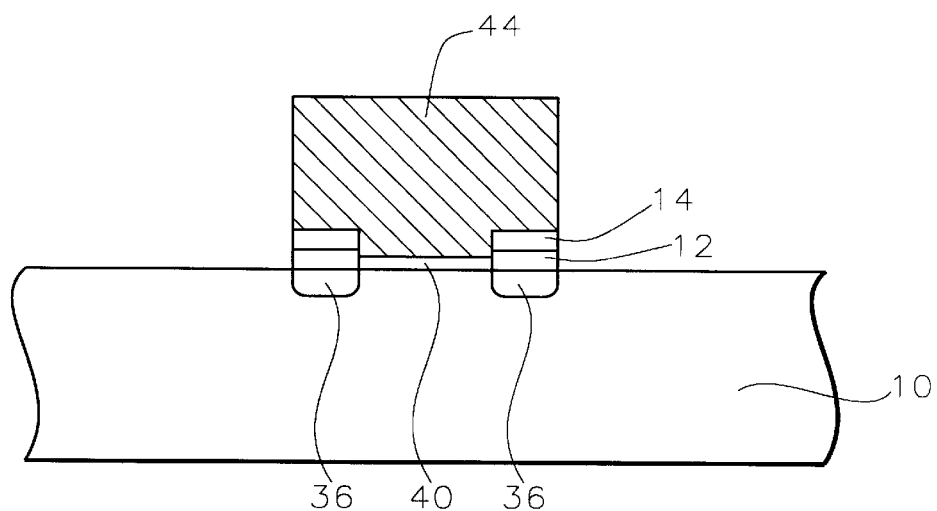

Now, the nitride/oxide/nitride/oxide film stack 18/16/14/12 is etched away using the gate electrode 44 as a hard mask. Complete removal of the nitride/oxide layers 14/12, shown in FIG. 12, is optional.

Figure 13:
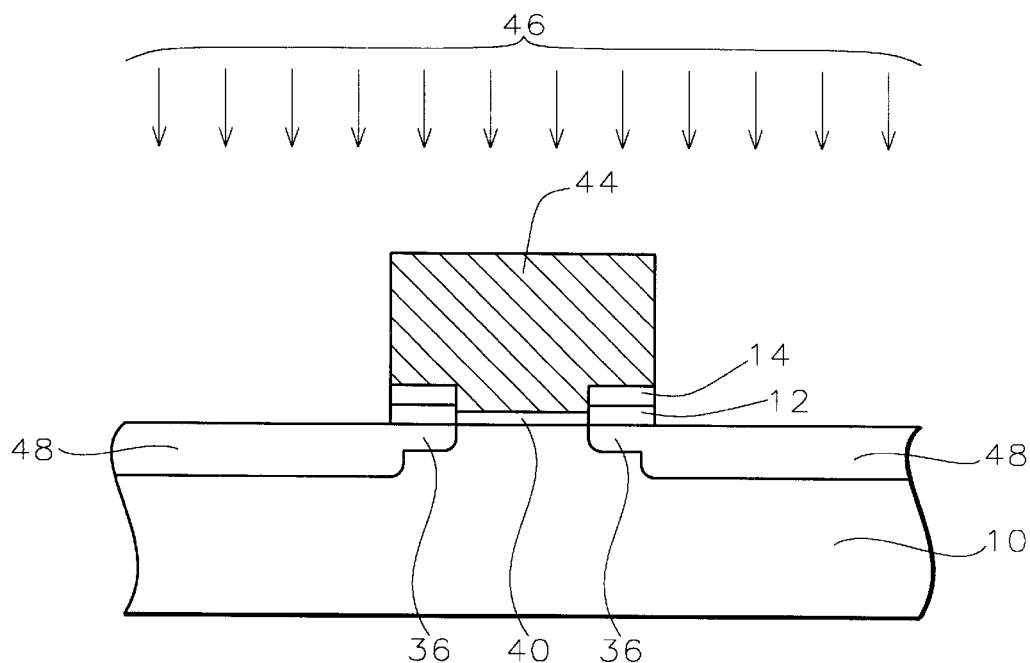

Referring now to FIG. 13, an ion implantation 46 is performed to form source and drain regions 48, followed by a rapid thermal anneal (RTA), for example, to activate the dopants. This completes formation of the short channel MOS transistor. A wider gate has been fabricated using existing masks and lithography techniques. The wider gate has lower gate resistance and reduced parasitic capacitance. Landing of contact pads will also be easier on the wider gates of the present invention. "Wider" is relative to the channel length which becomes smaller than in the prior art. For example, opening 19 may be defined as 0.1 µm using existing lithography techniques. By using oxide spacers 24, the final channel length may be reduced to 0.03 µm. Hence, the top portion of the gate becomes "wider".

Figure 14:
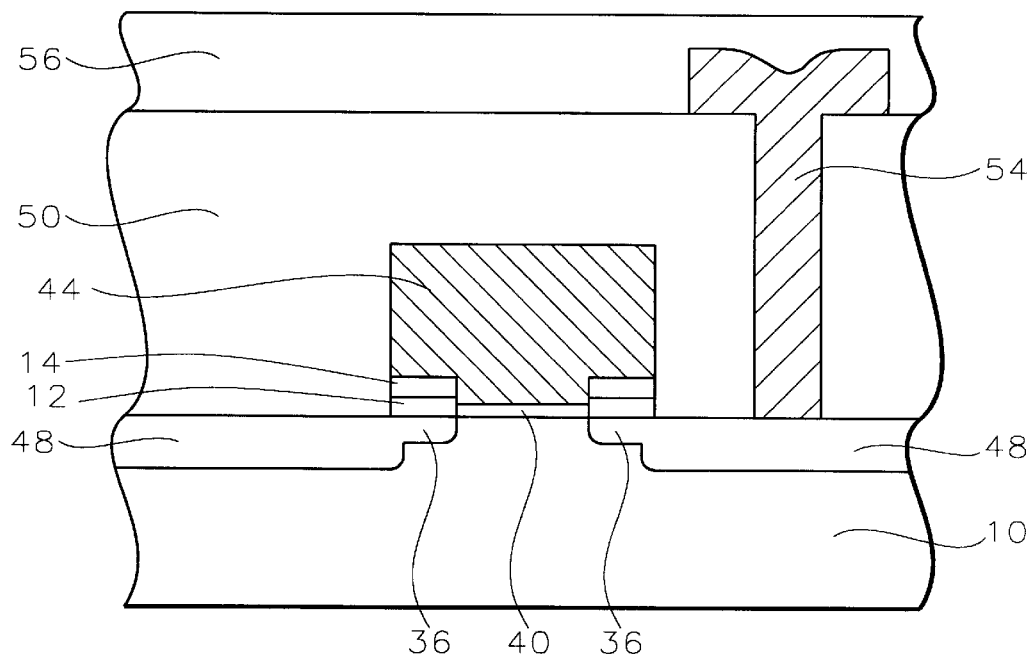
FIG. 14 schematically illustrates in cross-sectional representation a completed integrated circuit device fabricated according to a preferred embodiment of the present invention.

The integrated circuit device is completed as is conventional in the art. For example, as illustrated in FIG. 14, insulating layer 50 is deposited over the surface of the substrate. Contact openings are made through the insulating layer to the underlying semiconductor devices, such as to the source/drain 48. A metal layer 54 is deposited and patterned to form electrical connections between the elements of the integrated circuit. A passivation layer 56 completes the fabrication of the integrated circuit.

The process of the invention provides a method of fabricating a short channel MOS transistor using existing lithographic techniques and mask sets. This process effectively reduces the channel length, which in turn causes a relative increase in the width of the gate, thus reducing gate resistance and parasitic capacitance of the transistor.

While the invention has been particularly shown and described with reference to the preferred embodiments thereof, it will be understood by those skilled in the art that various changes in form and details may be made without departing from the spirit and scope of the invention.

What is claimed is:

1. A method of forming a short channel MOS transistor in the fabrication of an integrated circuit device comprising:

forming a hard mask stack over a substrate;

forming a first opening through a top portion of said hard mask stack;

forming oxide spacers on sidewalls of said first opening thereby forming a second opening smaller than said first opening;

filling said second opening between said spacers with a polysilicon layer;

thereafter removing said oxide spacers;

implanting first ions into said substrate underlying removed said oxide spacers to form source/drain extensions;

thereafter removing said polysilicon layer wherein said first opening remains and wherein said substrate is exposed in a channel region;

forming a gate dielectric layer over said channel region;

filling said first opening with a gate electrode material and polishing back said gate electrode material to form a gate electrode;

thereafter removing said hard mask stack using said gate electrode as a mask; and implanting second ions to form source/drain regions within said substrate adjacent to said gate electrode to complete formation of said short channel MOS transistor in the fabrication of said integrated circuit device.

2. The method according to claim 1 wherein said step of forming said hard mask stack comprises:

providing a sacrificial oxide layer on a surface of said substrate;

depositing a first polish stop layer overlying said sacrificial oxide layer;

depositing a second oxide layer overlying said first polish stop layer; and depositing a second polish stop layer overlying said second oxide layer.

3. The method according to claim 2 wherein said sacrificial oxide layer comprises silicon dioxide having a thickness of between about 10 and 150 Angstroms.

4. The method according to claim 2 wherein said first polish stop layer comprises silicon nitride having a thickness of between about 200 and 500 Angstroms.

5. The method according to claim 2 wherein said second oxide layer comprises silicon dioxide having a thickness of between about 200 and 1000 Angstroms.

6. The method according to claim 2 wherein said second polish stop layer comprises silicon nitride having a thickness of between about 200 and 1500 Angstroms.

7. The method according to claim 1 prior to said step of forming a gate dielectric layer over said channel region further comprising ion implanting a threshold voltage adjustment into said channel region.

8. The method according to claim 1 wherein said step of forming a gate dielectric layer over said channel region comprises thermally growing a gate silicon dioxide layer overlying said substrate.

9. The method according to claim 1 wherein said step of forming a gate dielectric layer over said channel region comprises depositing a high dielectric constant gate dielectric layer overlying said substrate.

10. The method according to claim 1 wherein said gate material layer is selected from the group consisting of: polycrystalline silicon germanium, polysilicon and metals.

11. The method according to claim 1 wherein said polishing back step comprises chemical mechanical polishing.

12. A method of forming a short channel MOS transistor in the fabrication of an integrated circuit device comprising:
   forming a hard mask stack over a substrate;
   forming a first opening through a top portion of said hard mask stack;
   forming oxide spacers on sidewalls of said first opening thereby forming a second opening smaller than said first opening;
   filling said second opening between said spacers with a polysilicon layer;
   thereafter removing said oxide spacers thereby exposing a lower portion of said hard mask stack;
   implanting first ions into said substrate through said exposed portion of said hard mask stack to form source/drain extensions;
   thereafter removing said polysilicon layer wherein said first opening remains;
   removing remaining portion of said hard mask stack underlying removed said polysilicon layer thereby exposing said substrate in a channel region;
   forming a gate dielectric layer over said channel region;
   filling said first opening with a gate electrode material and polishing back said gate electrode material to form a gate electrode;
   thereafter removing said hard mask stack using said gate electrode as a mask; and
   implanting second ions to form source/drain regions within said substrate adjacent to said gate electrode to complete formation of said short channel MOS transistor in the fabrication of said integrated circuit device.

13. The method according to claim 12 wherein said step of forming said hard mask stack comprises:
   providing a sacrificial oxide layer on a surface of said substrate;
   depositing a first polish stop layer overlying said sacrificial oxide layer;
   depositing a second oxide layer overlying said first polish stop layer; and
   depositing a second polish stop layer overlying said second oxide layer.

14. The method according to claim 12 prior to said step of forming a gate dielectric layer over said channel region further comprising ion implanting a threshold voltage adjustment into said channel region.

15. The method according to claim 12 wherein said step of forming a gate dielectric layer over said channel region comprises thermally growing a gate silicon dioxide layer overlying said substrate.

16. The method according to claim 12 wherein said step of forming a gate dielectric layer over said channel region comprises depositing a high dielectric constant gate dielectric layer overlying said substrate.

17. The method according to claim 12 wherein said gate material layer is selected from the group consisting of: polycrystalline silicon germanium, polysilicon and metals.

18. The method according to claim 12 wherein said polishing back step comprises chemical mechanical polishing.

19. A method of forming a short channel MOS transistor in the fabrication of an integrated circuit device comprising:
   providing a sacrificial oxide layer on a surface of said substrate;
   depositing a first polish stop layer overlying said sacrificial oxide layer;
   depositing a second oxide layer overlying said first polish stop layer;
   depositing a second polish stop layer overlying said second oxide layer wherein said sacrificial oxide layer, said first polish stop layer, said second oxide layer, and said second polish stop layer form a hard mask stack;
   forming a first opening through said second polish stop layer;
   forming oxide spacers on sidewalls of said first opening wherein said second oxide layer within said first opening is also removed thereby forming a second opening smaller than said first opening;
   etching back said second polish stop layer to below the height of said oxide spacers and removing said first polish stop layer within said second opening;
   filling said second opening between said spacers with a polysilicon layer;
   thereafter removing said oxide spacers thereby exposing said first polish stop layer;
   implanting first ions into said substrate through said exposed portion of said first polish stop layer and underlying said sacrificial oxide layer to form source/drain extensions;
   thereafter removing said polysilicon layer wherein said first opening remains;
   removing;said sacrificial oxide layer underlying removed said polysilicon layer thereby exposing said substrate in a channel region;
   forming a gate dielectric layer over said channel region;
   filling said first opening with a gate electrode material and polishing back said gate electrode material to form a gate electrode;
   thereafter removing said hard mask stack using said gate electrode as a mask; and
   implanting second ions to form source/drain regions within said substrate adjacent to said gate electrode to complete formation of said short channel MOS transistor in the fabrication of said integrated circuit device.

20. The method according to claim 19 wherein said first and second polish stop layers comprise silicon nitride.

21. The method according to claim 19 prior to said step of forming a gate dielectric layer over said channel region further comprising ion implanting a threshold voltage adjustment into said channel region.

22. The method according to claim 19 wherein said step of forming a gate dielectric layer over said channel region comprises thermally growing a gate silicon dioxide layer overlying said substrate.

23. The method according to claim 19 wherein said step of forming a gate dielectric layer over said channel region comprises depositing a high dielectric constant gate dielectric layer overlying said substrate.

24. The method according to claim 19 wherein said gate material layer is selected from the group consisting of: polycrystalline silicon germanium, polysilicon and metals.

25. The method according to claim 19 wherein said polishing back step comprises chemical mechanical polishing.

* * * * *